United States Patent
Shiota

(10) Patent No.: US 10,847,700 B2
(45) Date of Patent: Nov. 24, 2020

(54) PACKAGE, LIGHT EMITTING DEVICE, METHOD OF MANUFACTURING PACKAGE, AND METHOD OF MANUFACTURING LIGHT EMITTING DEVICE

(71) Applicant: NICHIA CORPORATION, Anan (JP)

(72) Inventor: Yuki Shiota, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/449,447

(22) Filed: Jun. 24, 2019

(65) Prior Publication Data

US 2019/0393391 A1    Dec. 26, 2019

(30) Foreign Application Priority Data

Jun. 25, 2018    (JP) .................... 2018-120211

(51) Int. Cl.
*H01L 33/62*    (2010.01)
*H01L 33/48*    (2010.01)

(52) U.S. Cl.
CPC ............ *H01L 33/62* (2013.01); *H01L 33/486* (2013.01); *H01L 2933/0033* (2013.01); *H01L 2933/0066* (2013.01)

(58) Field of Classification Search
CPC .............. H01L 33/62; H01L 33/486; H01L 2933/0033; H01L 33/0066
USPC ........................................................... 257/99
See application file for complete search history.

(56) References Cited

U.S. PATENT DOCUMENTS

2007/0130759 A1    6/2007   Harnden et al.
2013/0113015 A1*   5/2013   Kimura ............... H01L 25/0753
                                                       257/99

FOREIGN PATENT DOCUMENTS

| JP | 2007-300088 | 11/2007 |
| JP | 2010-021231 | 1/2010 |
| JP | 2013-101996 | 5/2013 |
| JP | 3192859 U | 9/2014 |

* cited by examiner

*Primary Examiner* — Tong-Ho Kim
(74) *Attorney, Agent, or Firm* — Mori & Ward, LLP

(57) ABSTRACT

A package includes a first lead, a first molded body, a second lead, and a second molded body. The first lead includes a first portion which has a first recess portion or a first through hole passing through the first portion. The second lead is provided on the first lead to be bonded to the first lead such that a bonding side surface faces to the first lead. The second lead includes a second portion which overlaps with the first portion and which has a second recess portion on the bonding side surface or a second through hole passing through the second portion. The second recess portion communicates with the first through hole. The second through hole communicates with the first recess portion. The second molded body fills the first through hole and the second recess portion, or fills the first recess portion and the second through hole.

18 Claims, 17 Drawing Sheets

PACKAGE, LIGHT EMITTING DEVICE, METHOD OF MANUFACTURING PACKAGE, AND METHOD OF MANUFACTURING LIGHT EMITTING DEVICE

CROSS-REFERENCE TO RELATED APPLICATIONS

The present application claims priority under 35 U.S.C. § 119 to Japanese Patent Application No. 2018-120211, filed Jun. 25, 2018. The contents of this application are incorporated herein by reference in their entirety.

BACKGROUND OF THE INVENTION

Field of the Invention

The present disclosure relates to a package, a light emitting device, a method of manufacturing the package, and a method of manufacturing the light emitting device.

Discussion of the Background

As a flip chip mounting package for mounting a light emitting element, a package having a structure in which two leads are stacked is known (for example, Japanese Utility Model Registration No. 3192859 and Japanese Unexamined Patent Application Publication Nos. 2010-021231 and 2007-300088). In the conventional package, two leads are bonded by resin, solder, or the like.

SUMMARY OF THE INVENTION

According to one aspect of the present invention, a package includes a first lead, a first molded body holding the first lead, a second lead, and a second molded body holding the second lead. The first lead includes a first portion which has a first recess portion or a first through hole passing through the first portion. The second lead has a bonding side surface and is provided on the first lead to be bonded to the first lead such that the bonding side surface faces to the first lead. The second lead includes a second portion which overlaps with the first portion and which has a second recess portion on the bonding side surface or a second through hole passing through the second portion, the second recess portion communicating with the first through hole. The second through hole communicates with the first recess portion which faces to the second portion. The first portion of the first lead and the second portion of the second lead are electrode terminals. The second molded body fills the first through hole and the second recess portion, or fills the first recess portion and the second through hole.

According to another aspect of the present invention, a package includes a first lead, a first molded body holding the first lead, a second lead, and a second molded body holding the second lead. The first lead includes a first portion which has a first recess portion. The second lead has a bonding side surface and is provided on the first lead to be bonded to the first lead such that the bonding side surface faces to the first lead. The second lead includes a second portion which overlaps with the first portion and which has a second recess portion on the bonding side surface or a second through hole passing through the second portion. The second recess portion communicates with the first through hole. The second through hole communicates with the first recess portion which faces to the second portion. The first portion of the first lead and the second portion of the second lead are electrode terminals. The second molded body fills the first recess portion and the second recess portion.

According to the other aspect of the present invention, a method of manufacturing a package includes providing a first lead including a first electrode terminal which has a first recess portion or a first through hole passing through the first electrode terminal; holding the first lead with a first molded body; providing a second lead on the first lead to be bonded to the first lead such that the bonding side surface of the second lead faces to the first lead, the second lead including a second electrode terminal which overlaps with the first electrode terminal and which has a second recess portion on the bonding side surface or a second through hole passing through the second electrode terminal, the second recess portion communicating with the first through hole, the second through hole communicating with the first recess portion which faces to the second electrode terminal; holding the second lead with a second molded body; and filling the first through hole and the second recess portion, or the first recess portion and the second through hole with the second molded body.

According to further aspect of the present invention, a method of manufacturing a package includes providing a first lead including a first electrode terminal which has a first recess portion; holding the first lead with a first molded body; providing a second lead on the first lead to be bonded to the first lead such that the bonding side surface of the second lead faces to the first lead, the second lead including a second electrode terminal which overlaps with the first electrode terminal and which has a second recess portion on the bonding side surface, the second recess portion communicating with the first recess portion which faces to the second electrode terminal; holding the second lead with a second molded body; and filling the first recess portion and the second recess portion with the second molded body.

According to the further aspect of the present invention, a package includes a first lead, a second lead, and a molded body holding the first lead and the second lead. The first lead includes a first electrode terminal which has a first recess portion or a first through hole passing through the first electrode terminal. The second lead has a bonding side surface and is provided on the first lead to be bonded to the first lead such that the bonding side surface faces to the first lead. The second lead includes a second electrode terminal which overlaps with the first electrode terminal and which has a second recess portion on the bonding side surface or a second through hole passing through the second electrode terminal. The second recess portion communicates with the first through hole. The second through hole communicates with the first recess portion which faces to the second electrode terminal. The molded body fills the first through hole and the second recess portion, or fills the first recess portion and the second through hole.

According to the further aspect of the present invention, a package includes a first lead, a second lead, and a molded body holding the first lead and the second lead. The first lead includes a first electrode terminal which has a first recess portion. The second lead has a bonding side surface and is provided on the first lead to be bonded to the first lead such that the bonding side surface faces to the first lead. The second lead includes a second electrode terminal which overlaps with the first electrode terminal and which has a second recess portion on the bonding side surface. The second recess portion communicates with the first recess portion which faces to the second electrode terminal. The molded body fills the first recess portion and the second recess portion.

According to the further aspect of the present invention, a method of manufacturing a package includes providing a first lead including a first electrode terminal which has a first recess portion or a first through hole passing through the first electrode terminal; providing a second lead on the first lead to be bonded to the first lead such that the bonding side surface of the second lead faces to the first lead, the second lead including a second electrode terminal which overlaps with the first electrode terminal and which has a second recess portion on the bonding side surface or a second through hole passing through the second electrode terminal, the second recess portion communicating with the first through hole, the second through hole communicating with the first recess portion which faces to the second electrode terminal; holding the first lead and the second lead with a molded body; and filling the first through hole and the second recess portion, or the first recess portion and the second through hole with the molded body.

According to the further aspect of the present invention, a method of manufacturing a package includes providing a first lead including a first electrode terminal which has a first recess portion; providing a second lead on the first lead to be bonded to the first lead such that the bonding side surface of the second lead faces to the first lead, the second lead including a second electrode terminal which overlaps with the first electrode terminal and which has a second recess portion on the bonding side surface, the second recess portion communicating with the first recess portion which faces to the second electrode terminal; holding the first lead and the second lead with a molded body; and filling the first recess portion and the second recess portion with the molded body.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1A:
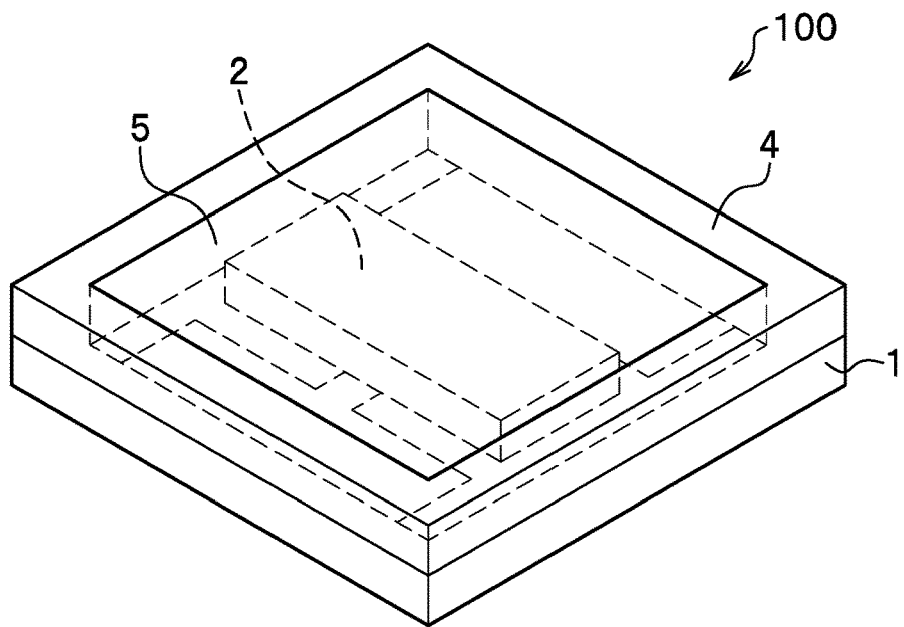
FIG. 1A is a schematic perspective view illustrating a configuration of a package and a light emitting device according to a first embodiment.

The embodiments will now be described with reference to the accompanying drawings, wherein like reference numerals designate corresponding or identical elements throughout the various drawings.

Embodiments are described below with reference to drawings. The aspects described below, however, only exemplify a package, a light emitting device, and methods of manufacturing them to embody technical ideas of the present embodiments, and the present embodiments are not limited to these aspects. Further, the embodiments are not intended to limit the scope of the present invention only to, for example, the dimensions, the materials, and the shapes of constituent components, and the relative disposition among the constituent components described in the embodiments unless otherwise specified, and these details are no more than exemplification. The size, the positional relationship, and the like of members illustrated in the drawings are sometimes exaggerated for clear description.

First Embodiment

Figure 1B:
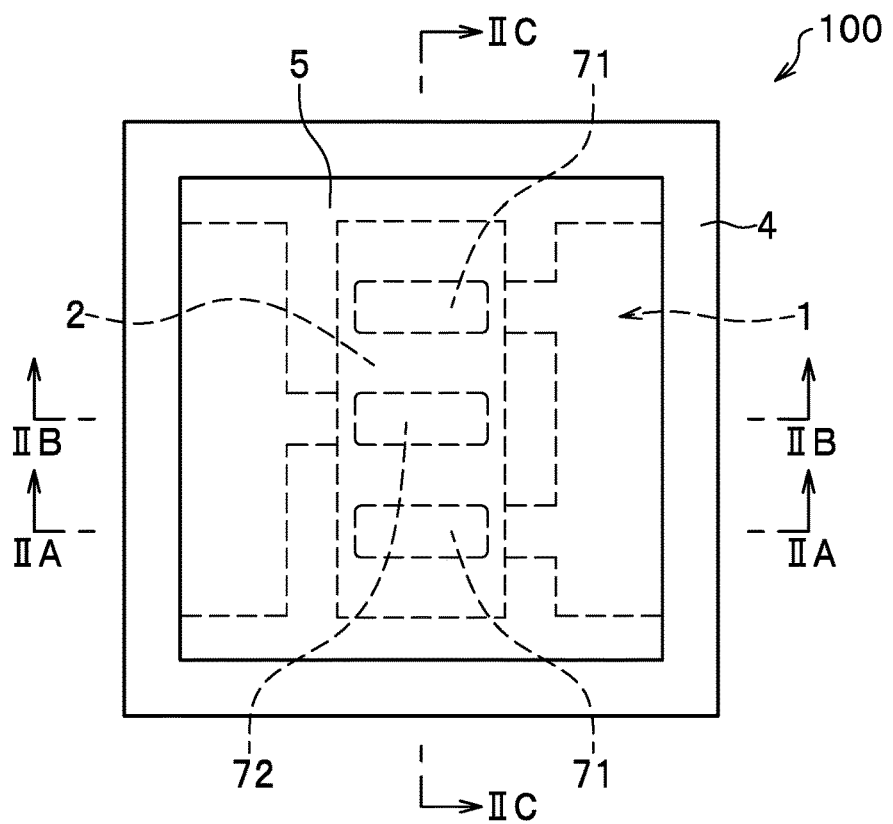
FIG. 1B is a schematic plan view illustrating the configuration of the package and the light emitting device according to the first embodiment.
Figure 2A:
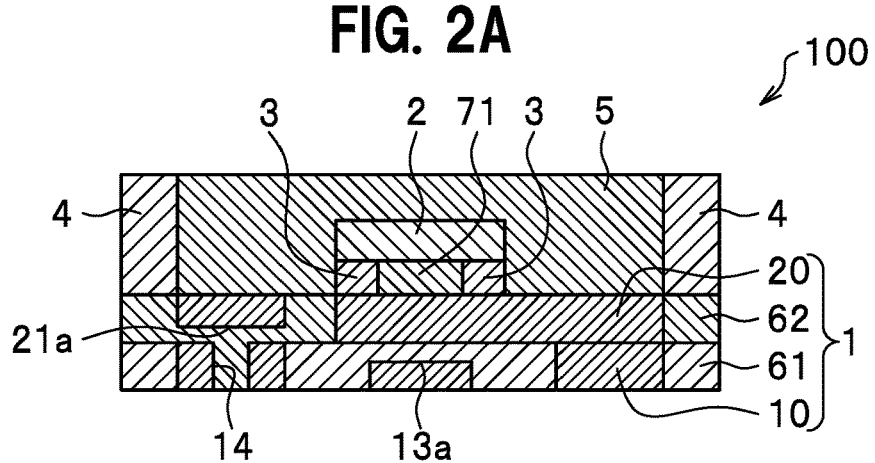
FIG. 2A is a schematic sectional view taken along the line IIA-IIA in FIG. 1B.
Figure 2B:
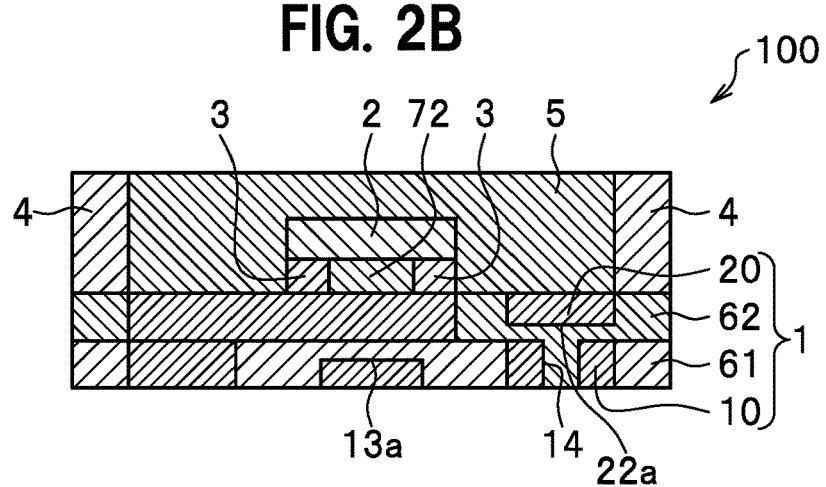
FIG. 2B is a schematic sectional view taken along the line IIB-IIB in FIG. 1B.
Figure 2C:
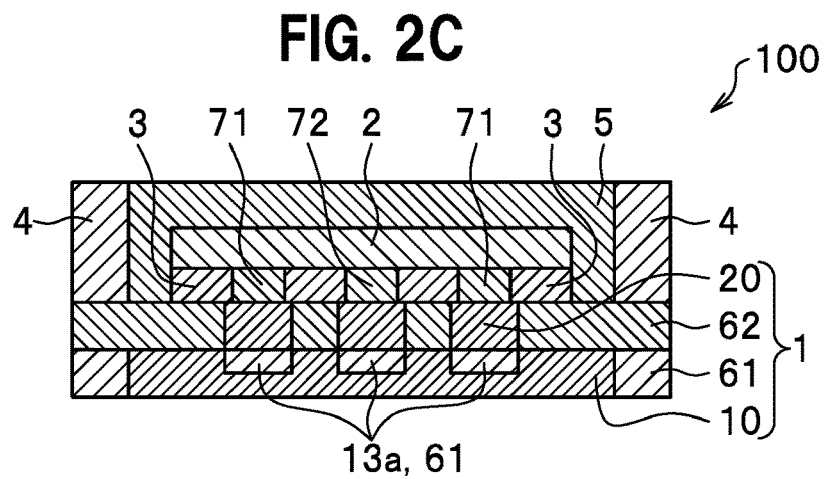
FIG. 2C is a schematic sectional view taken along the line IIC-IIC in FIG. 1B.
Figure 3A:
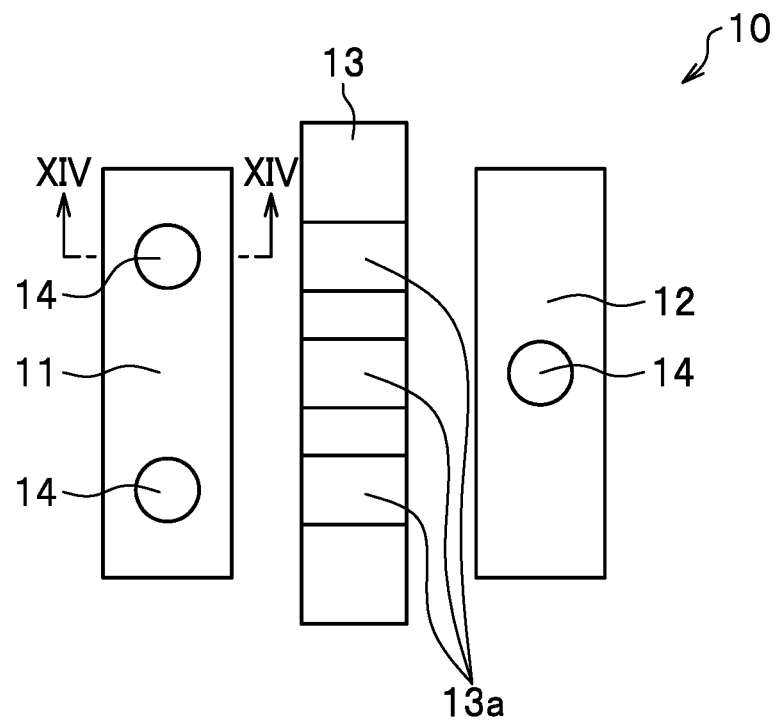
FIG. 3A is a schematic plan view illustrating a configuration of a first lead according to the first embodiment.
Figure 3B:
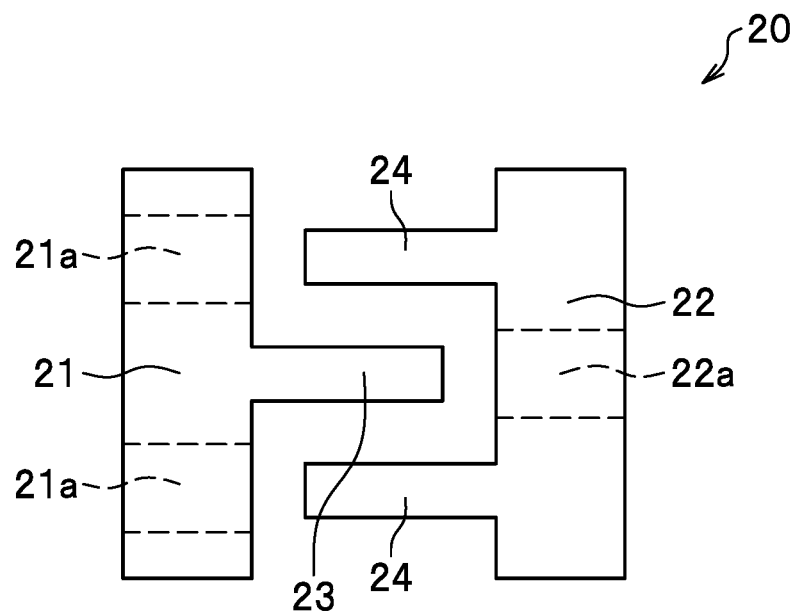
FIG. 3B is a schematic plan view illustrating a configuration of a second lead according to the first embodiment.
Figure 4A:
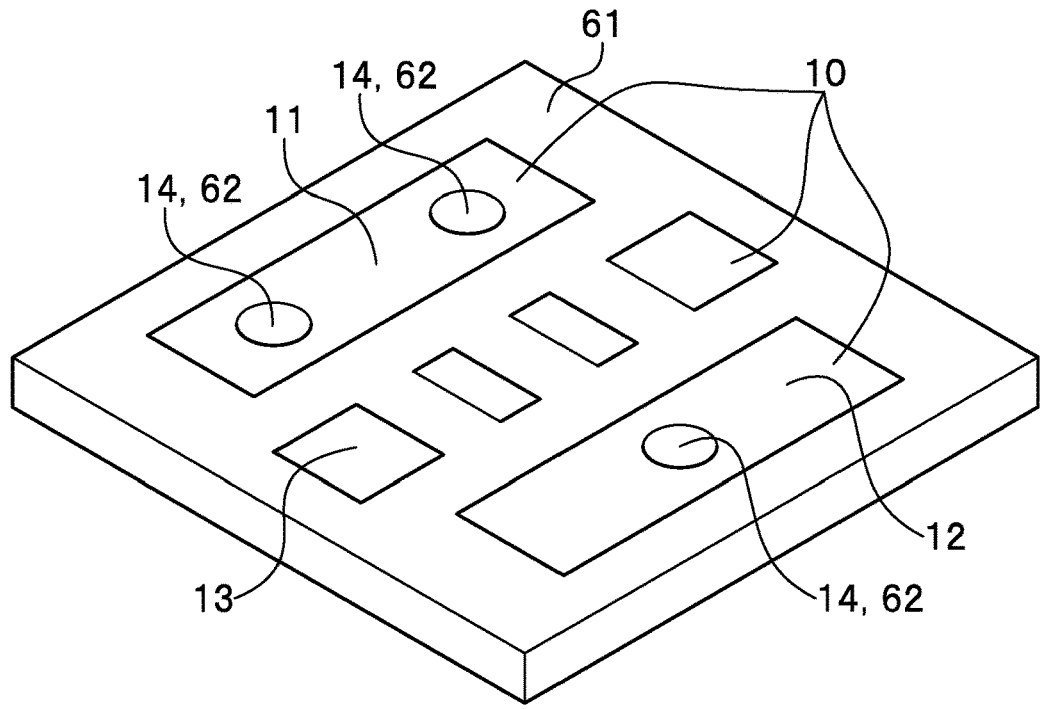
FIG. 4A is a schematic perspective view illustrating the configuration of the first lead according to the first embodiment that is provided with a first molded body.
Figure 4B:
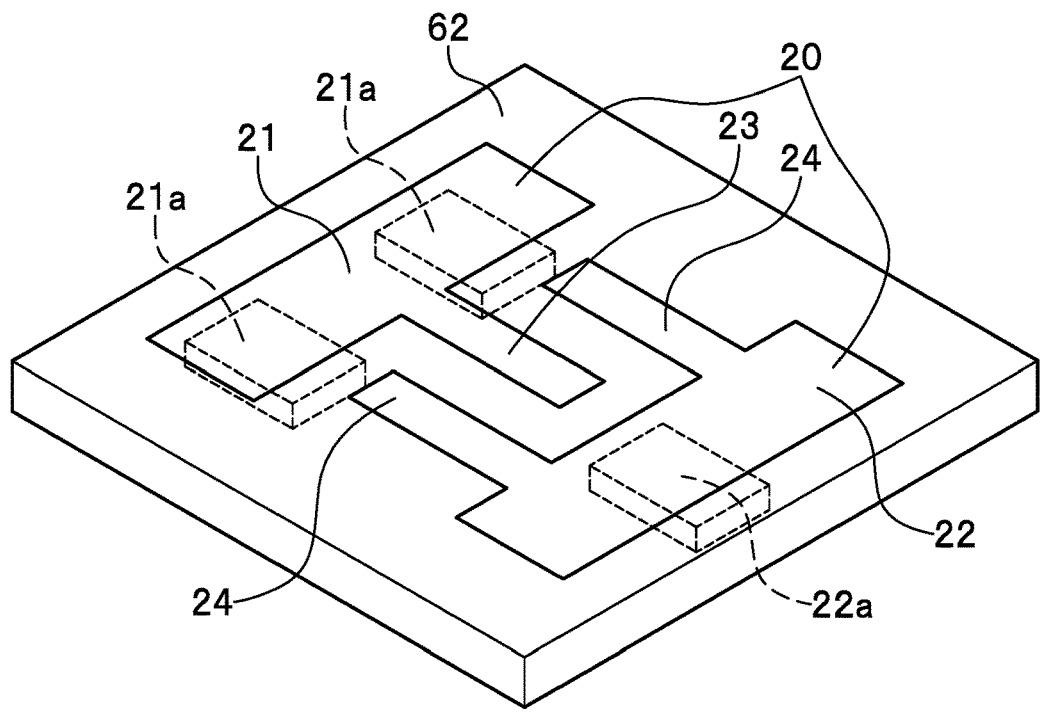
FIG. 4B is a schematic perspective view illustrating the configuration of the second lead according to the first embodiment that is provided with a second molded body.

FIG. 1A is a schematic perspective view illustrating a configuration of a package and a light emitting device according to a first embodiment. FIG. 1B is a schematic plan view illustrating the configuration of the package and the light emitting device according to the first embodiment. FIG. 2A is a schematic sectional view taken along the line IIA-IIA in FIG. 1B. FIG. 2B is a schematic sectional view taken along the line IIB-IIB in FIG. 1B. FIG. 2C is a schematic sectional view taken along the line IIC-IIC in FIG. 1B. FIG. 3A is a schematic plan view illustrating a configuration of a first lead according to the first embodiment. FIG. 3B is a schematic plan view illustrating a configuration of a second lead according to the first embodiment. FIG. 4A is a schematic perspective view illustrating the configuration of the first lead according to the first embodiment that is provided with a first molded body. FIG. 4B is a schematic perspective view illustrating the configuration of the second lead according to the first embodiment that is provided with a second molded body.

A light emitting device 100 includes a package 1 and a light emitting element 2 mounted on the package 1. The light emitting device 100 further has a frame body 4 formed to surround the light emitting element 2, and a covering member 5 formed in the frame body 4 to cover the light emitting element 2.

Package

First, the package 1 will be described. The package 1 includes a first lead 10, a first molded body 61, a second lead 20, and a second molded body 62. The package 1 includes the first lead 10 having a first through hole 14 in first portions 11 and 12, the first molded body 61 holding the first lead 10, the second lead 20 having second recess portions 21a and 22a provided in second portions 21 and 22, overlapping the first portions 11 and 12 of the first lead 10, on a surface side face-to-face bonded to the first lead 10 and communicating with the first through hole 14, and the second molded body 62 holding the second lead 20. The first portions 11 and 12 of the first lead 10 and the second portions 21 and 22 of the second lead 20 are electrode terminals, and a portion of the second molded body 62 is continuously filled in the first through hole 14 and the second recess portions 21a and 22a communicating with the first through hole 14.

First Lead

The first lead 10 is held by the first molded body 61. The first lead 10 has a prescribed wiring pattern. The first lead 10 includes the P-side first portion (hereinafter, referred to as a first P-side electrode terminal for convenience) 11 as a P-side electrode terminal and an N-side first portion (hereinafter, referred to as a first N-side electrode terminal for convenience) 12 as an N-side electrode terminal, which are arranged in parallel, and preferably includes a third portion (hereinafter, referred to as a heat dissipation terminal for convenience) 13 as a heat dissipation terminal, which is disposed spaced apart between the first P-side electrode terminal 11 and the first N-side electrode terminal 12.

The first P-side electrode terminal 11 is a member bonded to and conductive with a P-side electrode terminal (hereinafter, referred to as a second P-side electrode terminal for convenience) 21 of the second lead 20. The first P-side electrode terminal 11 is positioned on the left side from the center of the first lead 10 in planar view and is formed in a rectangular shape. The first P-side electrode terminal 11 has the two first through holes 14 penetrating in a plate thickness direction on one side and the other side in a longitudinal direction.

The first N-side electrode terminal 12 is a member bonded to and conductive with an N-side electrode terminal (hereinafter, referred to as a second N-side electrode terminal for convenience) 22 of the second lead 20. The first N-side electrode terminal 12 is positioned on the right side from the center of the first lead 10 in planar view and is formed in a rectangular shape. The first N-side electrode terminal 12 has the single first through hole 14 penetrating in the plate thickness direction on a central side in the longitudinal direction.

The first P-side electrode terminal 11 and the first N-side electrode terminal 12 each have both surfaces thereof exposed from the first molded body 61 holding the first lead 10. After the first lead 10 is bonded to the second lead 20, a portion of the second molded body 62 holding the second lead 20 is filled in each of the first through holes 14, formed in the first P-side electrode terminal 11 and the first N-side electrode terminal 12 on the front surface side and the rear surface side, through the second recess portions 21a and 22a of the second lead 20.

The heat dissipation terminal 13 is a member for efficiently leading the heat generated from the light emitting element 2 to the outside and improving heat dissipation of the light emitting device 100. The heat dissipation terminal 13 is formed in a rectangular shape at a center portion of the first lead 10 in planar view. The heat dissipation terminal 13 is disposed being spaced apart from the first P-side electrode terminal 11 and the first N-side electrode terminal 12 and is electrically independent from the first P-side electrode terminal 11 and the first N-side electrode terminal 12.

The heat dissipation terminal 13 has its front surface etched to about half of its thickness at a portion overlapping a P-side fourth portion 23 and an N-side fourth portion 24 of the second lead 20 in planar view (hereinafter, referred to as half-etching for convenience). The heat dissipation terminal 13 has a plurality of third recess portions 13a formed by half etching. Although the three third recess portions 13a are formed corresponding to the number of electrodes of the light emitting element 2 here, the number of third recess portions 13a may be increased or decreased. For example, of the three third recess portions 13a, only two at both ends may be formed. At this time, a portion in the middle of the heat dissipation terminal 13 is electrically connected to the second P-side electrode terminal 21. This is because it is sufficient to prevent a short circuit between the portion in the middle of the heat dissipation terminal 13 and two portions at both ends of the heat dissipation terminal 13. The third recess portion 13a is a groove portion continuously formed between side surfaces of the heat dissipation terminal 13 along the heat dissipation terminal's plate width, and the first molded body 61 is filled in the third recess portion 13a as the groove portion. The heat dissipation terminal 13 has both surfaces thereof exposed from the first molded body 61 except the third recess portion 13a. A step difference or a concave may be provided on side surfaces of the first lead 10 and the second lead 20 by pressing, etching or the like. As a result, adhesion and moldability between the first lead 10 and the first molded body 61, and between the second lead 20 and the second molded body 62 can be enhanced.

Second Lead

The second lead 20 is held by the second molded body 62. The second lead 20 is disposed on the first lead 10 and is face-to-face bonded to the first lead 10. The second lead 20 has a wiring pattern different from the shape of the first lead 10. The second lead 20 includes the P-side second portion 21 as the second P-side electrode terminal and the N-side second portion 22 as the second N-side electrode terminal, which are arranged in parallel, and further includes a P-side fourth portion (hereinafter, referred to as a P-side terminal branched portion for convenience) 23 as a P-side terminal branched portion and an N-side fourth portion (hereinafter, referred to as an N-side terminal branched portion for convenience) 24 as an N-side terminal branched portion.

The second P-side electrode terminal 21 overlaps the first P-side electrode terminal 11 of the first lead 10 in planar view. The second P-side electrode terminal 21 is half-etched to have two recess portions 21a communicating with the first through hole 14 on the rear surface side. Each of the second recess portions 21a is a groove portion continuously formed between side surfaces of the second P-side electrode terminal 21 along the second P-side electrode terminal's plate width. The second lead 20 that has been bonded to the first lead 10 is filled, at the second recess portions 21a as the groove portions, with a portion of the second molded body 62 holding the second lead 20. The second P-side electrode terminal 21 has both surfaces thereof exposed from the second molded body 62 except the second recess portions 21a.

The second N-side electrode terminal 22 overlaps the first N-side electrode terminal 12 of the first lead 10 in planar view. The second N-side electrode terminal 22 is half-etched to have the second recess portions 22a communicating with the first through hole 14 on the rear surface side. The second recess portion 22a is a groove portion continuously formed between side surfaces of the second N-side electrode terminal 22 along the second N-side electrode terminal's plate width. The second lead 20 that has been bonded to the first lead 10 is filled, at the second recess portion 22a as the groove portion, with a portion of the second molded body 62. The second N-side electrode terminal 22 has both surfaces thereof exposed from the second molded body 62 except the second recess portions 22a.

Since a portion of the second molded body 62 is filled in the first through hole 14 and the second recess portions 21a and 22a, a bonding area between the first lead 10 and the second lead 20 is increased, so that the first lead 10 and the second lead 20 are bonded more firmly.

The first molded body 61 is not filled in advance in the first through holes 14 and the second recess portions 21a and 22a. Thereby, the later filling of the second molded body 62 into the first through hole 14 is not hindered by the first molded body 61. Thus, the first lead 10 is also held by the second molded body 62 via the first through hole 14 and the second recess portions 21a and 22a, and the first lead 10 and the second lead 20 are bonded more firmly.

The shape of the first through hole 14 is not particularly limited as long as the first through hole 14 can communicate with the second recess portions 21a and 22a and can be filled with the second molded body 62 to firmly bond the first lead 10 and the second lead 20. The first through hole 14 may have a cylindrical shape, a frustum shape, or an inner surface with protrusions and recesses. The shape is a circle, an ellipse, a square or the like in planar view, and a circular shape is preferable. Similarly, the shapes of the second recess portions 21a and 22a are not particularly limited as long as the second recess portions 21a and 22a can communicate with the first through hole 14 to firmly bond the first lead 10 and the second lead 20. The shape is a semicircle or a square, and a square shape or the like is preferable.

The number of first through holes 14 is not particularly limited as long as the first lead 10 and the second lead 20 can be firmly bonded, and three or more are preferable. The number of second recess portions 21a and 22a is preferably set to the same as the number of first through holes 14 because the second recess portions 21a and 22a are formed corresponding to the number of first through holes 14, but the number may be increased or decreased.

The first lead 10 and the second lead 20 are bonded to each other by direct bonding or using a bonding member such as an adhesive or solder at the portion on the front surface of the first lead 10 that is exposed from the first molded body 61 and the portion on the rear surface of the second lead 20 that is exposed from the second molded body 62 in the first P-side electrode terminal 11 and the second P-side electrode terminal 21.

The first lead 10 and the second lead 20 are bonded to each other by direct bonding or using a bonding member such as an adhesive or solder at the portion on the front surface of the first lead 10 that is exposed from the first molded body 61 and the portion on the rear surface of the second lead 20 that is exposed from the second molded body 62 in the first N-side electrode terminal 12 and the second N-side electrode terminal 22.

The first lead 10 and the second lead 20 are preferably bonded by direct bonding. Here, the direct bonding means bonding without using another member such as an adhesive agent. The direct bonding is preferably diffusion bonding. The diffusion bonding is a "method of closely attaching base materials to each other and pressing them with a pressure causing as little plastic deformation as possible, under a temperature condition of melting temperatures or lower of the base materials, to bond the base materials to each other utilizing atom diffusion generated between the surfaces of the base materials to be bonded". The direct bonding improves thermal conductivity and electrical conductivity.

The P-side terminal branched portion 23 is a portion to which a P-side electrode 72 of a light emitting element 2 is bonded. The P-side terminal branched portion 23 is formed continuously with and perpendicularly to the second P-side electrode terminal 21 and extends toward the center of the second lead 20 in planar view. The P-side terminal branched portion 23 is formed at a position that allows a portion thereof to overlap the heat dissipation terminal 13 of the first lead 10 in planar view. The P-side terminal branched portion 23 allows the portion thereof to perpendicularly overlap the heat dissipation terminal 13 in planar view. The heat dissipation terminal 13 of the first lead 10 has the third recess portion 13a to face a portion overlapping a portion of the P-side terminal branched portion 23. Therefore, in the heat dissipation terminal 13 and the P-side terminal branched portion 23, the first lead 10 is spaced apart from the second lead 20 with the third recess portion 13a interposed therebetween. The third recess portion 13a between the heat dissipation terminal 13 and the P-side terminal branched portion 23 allows continuous filling with a portion of the first molded body 61, and the first lead 10 and the second lead 20 are not in contact with each other.

The N-side terminal branched portion 24 is a portion to which an N-side electrode 71 of a light emitting element 2 is bonded. The N-side terminal branched portion 24 is formed continuously with and perpendicularly to the second N-side electrode terminal 22 and extends toward the center of the second lead 20 in planar view. The N-side terminal branched portion 24 is formed at a position that allows a portion thereof to overlap the heat dissipation terminal 13 of the first lead 10 in planar view. The N-side terminal branched portion 24 allows the portion thereof to perpendicularly overlap the heat dissipation terminal 13 in planar view. The heat dissipation terminal 13 of the first lead 10 has the third recess portion 13a to face a portion overlapping a portion of the N-side terminal branched portion 24. Therefore, in the heat dissipation terminal 13 and the N-side terminal branched portion 24, the first lead 10 is spaced apart from the second lead 20 with the third recess portion 13a interposed therebetween. The third recess portion 13a between the heat dissipation terminal 13 and the N-side terminal branched portion 24 allows continuous filling with a portion of the first molded body 61, and the first lead 10 and the second lead 20 are not in contact with each other.

The heat dissipation terminal 13 is spaced apart from the P-side terminal branched portion 23 and the N-side terminal branched portion 24 to enable the P-side terminal branched portion 23 and the N-side terminal branched portion 24 for mounting the light emitting element to be disposed on an upper surface of the heat dissipation terminal 13. Therefore, it is possible to form different electrode patterns between a front surface and a rear surface of the package 1. This makes it possible to use a mounting substrate having the same wiring pattern as the wiring pattern on the rear surface of the package 1 and to use the light emitting element having a different number of terminals such as three terminals.

The perpendicular disposition of the P-side terminal branched portion 23 and the N-side terminal branched portion 24 to the heat dissipation terminal 13 in planar view facilitates the mounting of the light emitting element 2. In addition, such disposition facilitates manufacturing of the package 1.

A material for the first lead 10 and the second lead 20 is, for example, copper, a copper alloy, iron, or an iron alloy. The first lead 10 and the second lead 20 may be plated. The plating is capable of increasing the reflectivity of light from the light emitting element 2.

Examples of the plating include gold, silver, copper, platinum, and an alloy containing one of these metals. The plating with these metals is capable of increasing the reflectivity of light from the light emitting element 2.

First Molded Body, Second Molded Body

The first molded body 61 is a member holding the first lead 10. The first molded body 61 is formed at the same thickness as that of the first lead 10. The second molded body 62 is a member holding the second lead 20. The second molded body 62 is formed at the same thickness as that of the second lead 20.

A material for the first molded body 61 and the second molded body 62 is, for example, a thermoplastic resin or a thermosetting resin. For the thermoplastic resin, it is possible to use, for example, a polyphthalamide resin, a liquid crystal polymer, polybutylene terephthalate (PBT), or unsaturated polyester. For the thermosetting resin, it is possible to use, for example, an epoxy resin, a modified epoxy resin, a silicone resin, or a modified silicone resin.

Light Emitting Device

Next, the light emitting device 100 is described. The light emitting device 100 includes the package 1, the light emitting element 2, underfill 3, a frame body 4, and a covering member 5. The light emitting device 100 that includes the package 1 is capable of improving the bonding strength between the leads. The package 1 is as described above and is not described here.

Light Emitting Element

The light emitting element 2 includes two N-side electrodes 71 and one P-side electrode 72 formed between the two N-side electrodes 71. The light emitting element 2 has the two N-side electrodes 71 thereof connected to two N-side terminal branched portions 24 of the second lead 20, respectively, and has the one P-side electrode 72 thereof connected to the P-side terminal branched portion 23 of the second lead 20. This allows the light emitting element 2 to be mounted on the second lead 20 of the package 1. The light emitting element 2 used here is not particularly limited in terms of its shape, size, or the like. As a light emission color of the light emitting element 2, it is possible to select any wavelength according to the use application of the light emitting device. For example, as a blue (light with a wavelength of 430 to 490 nm) light emitting element 2, it is possible to use a GaN material or an InGaN material. As the InGaN material, it is possible to use, for example, $In_XAl_YGa_{1-X-Y}N$ ($0 \leq X \leq 1$, $0 \leq Y \leq 1$, and $X+Y \leq 1$).

Underfill

The underfill 3 is a member that absorbs stress caused by the difference in coefficient of thermal expansion between the light emitting element 2 and the package 1 and increases the heat releasing property. The underfill 3 is formed in a gap between the package 1 and the light emitting element 2. A material for the underfill 3 is, for example, a thermosetting resin such as a silicone resin or an epoxy resin. Using, as the material for the underfill 3, a light reflective member such as a white resin is capable of reflecting light emitted from the light emitting element 2 toward the package 1 to increase the flux of light.

Frame Body

The frame body 4 is a member constituting a wall portion of the light emitting device 100. The frame body 4 is formed to surround the light emitting element 2. It is possible to form the frame body 4 by, for example, a thermoplastic resin, a thermosetting resin, a modified resin of these resins, or a hybrid resin containing at least one of these resins. Examples of the thermoplastic resin include a polyamide resin, a polyphthalamide resin, a polycarbonate resin, a polyphenylene sulfide resin, an ABS resin, an acrylic resin, a polybutylene terephthalate resin, a polyethylene terephthalate resin, a polycyclohexane terephthalate resin, and a liquid crystal polymer. Examples of the thermosetting resin include an epoxy resin, a silicone resin, a urea resin, a phenolic resin, a BT resin, a polyimide resin, and a polyurethane resin. These base materials may contain a material known in this field, such as a coloring agent, a filler, reinforcement fiber, or a fluorescent substance described later. Particularly, as the coloring agent, a material excellent in reflectivity is preferable, and a white material such as titanium oxide or zinc oxide is preferable. Examples of the filler include silica and alumina. Examples of the reinforcement fiber include glass, calcium silicate, and potassium titanate.

Covering Member

The covering member 5 is a member covering the light emitting element 2. The covering member 5 is provided in the frame body 4 on the package 1 to cover the light emitting element 2. The covering member 5 is provided to protect the light emitting element 2 from, for example, external force, dust, and moisture and to improve the heat resistance, the weather resistance, and the light stability of the light emitting element 2. A material for the covering member 5 is a thermosetting resin, for example, a transparent material such as a silicone resin, an epoxy resin, or a urea resin. It is possible to add to these materials a fluorescent material or a filler such as a high-light-reflectivity substance, for making the covering member have a prescribed function.

The covering member 5 having, for example, a fluorescent material mixed therein is capable of facilitating the color adjustment of the light emitting device 100. As the fluorescent material, it is possible to use a material that has a specific gravity larger than the specific gravity of the covering member 5, absorbs light from the light emitting element 2, and converts the wavelength of the light. The fluorescent material having a specific gravity larger than the specific gravity of the covering member 5 preferably settles on a package 1 side of the covering member. Specific examples of the fluorescent material include yellow fluorescent materials such as YAG ($Y_3Al_5O_{12}$:Ce) and silicate, red fluorescent materials such as CASN (CaAlSiN$_3$:Eu) and KSF ($K_2SiF_6$:Mn), and green fluorescent materials such as chlorosilicate and BaSiO$_4$:Eu$^{2+}$.

As the filler added to the covering member 5, it is possible to suitably use, for example, a high-light-reflectivity substance such as $SiO_2$, $TiO_2$, $Al_2O_3$, $ZrO_2$, or MgO. It is also possible to use, for example, an organic or inorganic coloring dye or coloring pigment for the purpose of cutting a wavelength other than a desired wavelength.

Method of Manufacturing Package

Figure 5A:
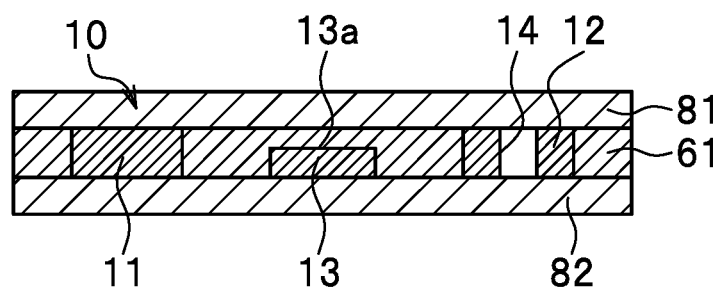
FIG. 5A is a schematic sectional view illustrating a step of forming the first molded body on the first lead in a method of manufacturing the package according to the first embodiment.
Figure 5B:
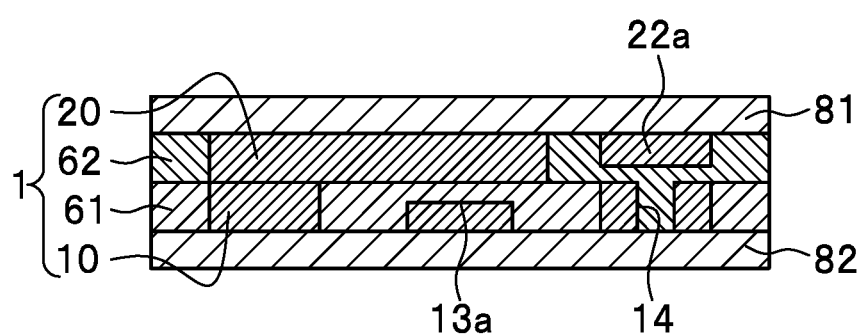
FIG. 5B is a schematic sectional view illustrating a step of forming the second molded body on the second lead in the method of manufacturing the package according to the first embodiment.

Next, a method of manufacturing the package 1 will be described. FIG. 5A is a schematic sectional view illustrating a step of forming the first molded body on the first lead in the method of manufacturing the package according to the first embodiment. FIG. 5B is a schematic sectional view illustrating a step of forming the second molded body on the second lead in the method of manufacturing the package according to the first embodiment. FIGS. 5A and 5B schematically illustrate one package of a plurality of packages manufactured simultaneously.

The method of manufacturing the package includes the steps of: preparing a first lead and a second lead, and filling a second molded body, and these steps are performed in this order. The materials, the disposition, and the like of the members are as described above in the package 1 and are not described here for convenience.

Step of Preparing First Lead and Second Lead

The step of preparing a first lead and a second lead includes the steps of disposing the second lead 20 on the first lead 10 provided with the first molded body 61 and bonding the first lead 10 and the second lead 20.

In the disposing step, first, the first lead 10 having a prescribed wiring pattern and the second lead 20 having a prescribed wiring pattern are prepared. At this time, the first lead 10 may be half-etched at a predetermined position using a mask to form the third recess portion 13*a*. In addition, plating is performed as necessary on surfaces of the first lead 10 and the second lead 20 that are not to be bonded.

Next, the first molded body 61 is formed on the first lead 10. For the formation of the first molded body 61, first, the first lead 10 is sandwiched between an upper mold 81 and a lower mold 82, and a resin is injected between the molds. Next, the resin injected between the molds is cured to form the first molded body 61. Thereafter, burr is removed to shape the first molded body. In addition, the second lead 20 is disposed on the first lead 10 such that the first through hole 14 and the second recess portions 21*a* and 22*a* communicate with each other.

The bonding step is a step of bonding the first lead 10 and the second lead 20. In the bonding step, the first P-side electrode terminal 11 and the second P-side electrode terminal 21 (see FIGS. 3A and 3B) are bonded, and the first N-side electrode terminal 12 and the second N-side electrode terminal 22 (see FIGS. 3A and 3B) are bonded.

In the bonding step, in the first P-side electrode terminal 11 and the second P-side electrode terminal 21, and in the first N-side electrode terminal 12 and the second N-side electrode terminal 22, the first lead 10 and the second lead 20 are bonded such that the first through hole 14 and the second recess portions 21*a* and 22*a* communicate with each other. Also in the bonding step, the first lead 10 and the second lead 20 are bonded to space the heat dissipation terminal 13 apart from the P-side terminal branched portion 23 and the N-side terminal branched portion 24 by the third recess portion 13*a*.

The first lead 10 and the second lead 20 are bonded by direct bonding or using a bonding member such as an adhesive or solder. For example, when the first lead 10 and the second lead 20 are directly bonded, the second lead 20 is disposed on the first lead 10, and the first lead 10 and the second lead 20 are sandwiched between the upper mold 81 and the lower mold 82, heated at a predetermined temperature, and pressed at a predetermined pressure. As a result, the first P-side electrode terminal 11 and the second P-side electrode terminal 21 are directly bonded, and the first N-side electrode terminal 12 and the second N-side electrode terminal 22 are directly bonded.

Step of Filling Second Molded Body

In the step of filling the second molded body, the second molded body 62 holding the second lead 20 is formed, and a portion of the second molded body 62 is filled in the first through hole 14 and the second recess portions 21*a* and 22*a* so as to be continuous with the first lead 10 to hold the first lead 10 even in the second molded body 62.

In this step, the first lead 10 and the second lead 20 are sandwiched between the upper mold 81 and the lower mold 82, and a resin is injected between the molds. Thereby, the resin is injected also into the through hole 14 via the second recess portions 21*a* and 22*a*. Next, the resin injected between the molds is cured to form the second molded body 62. Thereafter, burr is removed to shape the first molded body.

By forming the second molded body 62 in the through hole 14 in this step, the bonding area of the first lead 10 and the second lead 20 is increased, and it is possible to obtain the package 1 in which the bonding strength between the leads is improved.

Method of Manufacturing Light Emitting Device

Next, a method of manufacturing the light emitting device 100 will be described.

Figure 6A:
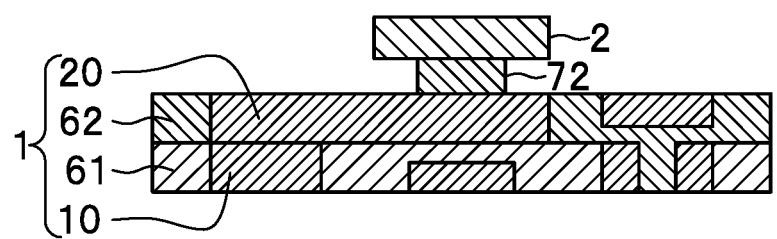
FIG. 6A is a schematic sectional view illustrating a step of mounting a light emitting element in a method of manufacturing the light emitting device according to the first embodiment.
Figure 6B:
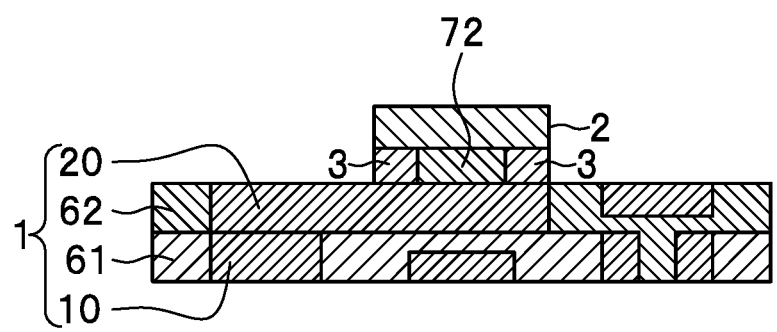
FIG. 6B is a schematic sectional view illustrating a step of forming underfill in the method of manufacturing the light emitting device according to the first embodiment.
Figure 6C:
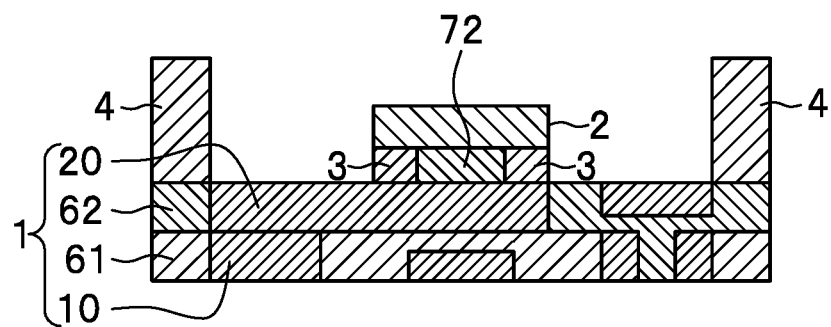
FIG. 6C is a schematic sectional view illustrating a step of forming a frame body in the method of manufacturing the light emitting device according to the first embodiment.
Figure 6D:
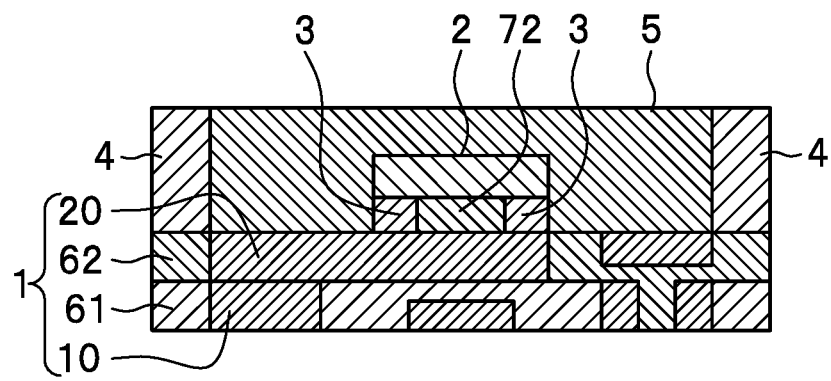
FIG. 6D is a schematic sectional view illustrating a step of forming a covering member in the method of manufacturing the light emitting device according to the first embodiment.

FIG. 6A is a schematic sectional view illustrating a step of mounting the light emitting element in the method of manufacturing the light emitting device according to the first embodiment. FIG. 6B is a schematic sectional view illustrating a step of forming the underfill in the method of manufacturing the light emitting device according to the first embodiment. FIG. 6C is a schematic sectional view illustrating a step of forming the frame body in the method of manufacturing the light emitting device according to the first embodiment. FIG. 6D is a schematic sectional view illustrating a step of forming the covering member in the method of manufacturing the light emitting device according to the first embodiment. FIGS. 6A to 6D schematically illustrate one light emitting device of a plurality of light emitting devices manufactured simultaneously.

The method of manufacturing the light emitting device includes the steps of: mounting a light emitting element, forming underfill, forming a frame body, forming a covering member, and division into pieces, and these steps are performed in this order. The materials, the disposition, and the like of the members are as described above in the light emitting device 100 and are not described here for convenience.

Step of Mounting Light Emitting Element

The step of mounting a light emitting element is a step of mounting the light emitting element 2 on the package 1 manufactured by the manufacturing method described above. In this step, the P-side electrode 72 of the light emitting element 2 is bonded to the P-side terminal branched portion 23 of the second lead 20, and the N-side electrode 71 of the light emitting element 2 is bonded to the N-side terminal branched portion 24 of the second lead 20 (see FIGS. 1B and 3B). The bonding may be performed using, for example, a solder paste.

By using the package 1 manufactured by the above-described manufacturing method in this step, it is possible to obtain the light emitting device 100 in which the bonding strength between the leads is improved.

Step of Forming Underfill

The step of forming underfill is a step of forming the underfill 3 in the gap between the package 1 and the light emitting element 2. The formation of the underfill 3 is performed by first injecting a material for the underfill 3 between the package 1 and the light emitting element 2 to fill the gap generated between the package 1 and the light emitting element 2. Next, the injected material for the underfill 3 is thermally cured. This forms the underfill 3 between the package 1 and the light emitting element 2. The formation of the underfill 3 may also be performed by disposing the material for the underfill 3 on the package 1 before mounting the light emitting element 2 and thermally curing the material after mounting the light emitting element 2.

Step of Forming Frame Body

The step of forming a frame body is a step of forming the frame body 4 to surround the light emitting element 2. It is possible to form the frame body 4 by, for example, using a discharge device (dispenser) capable of moving (movable) vertically or horizontally with respect to the second lead 20 above the second lead 20 fixed.

Step of Forming Covering Member

The step of forming a covering member is a step of forming the covering member 5 in the frame body 4. It is possible to form the covering member 5 by applying the covering member 5 in the frame body 4. It is also possible to form the covering member 5 by, for example, injection, compression, or extrusion.

Step of Division into Pieces

The step of division into pieces is a step of cutting and dividing an aggregate of light emitting devices 100 into pieces. It is possible to divide the aggregate into pieces by a conventionally known method such as a dicing method of performing cutting with a blade.

Second Embodiment

Figure 7A:
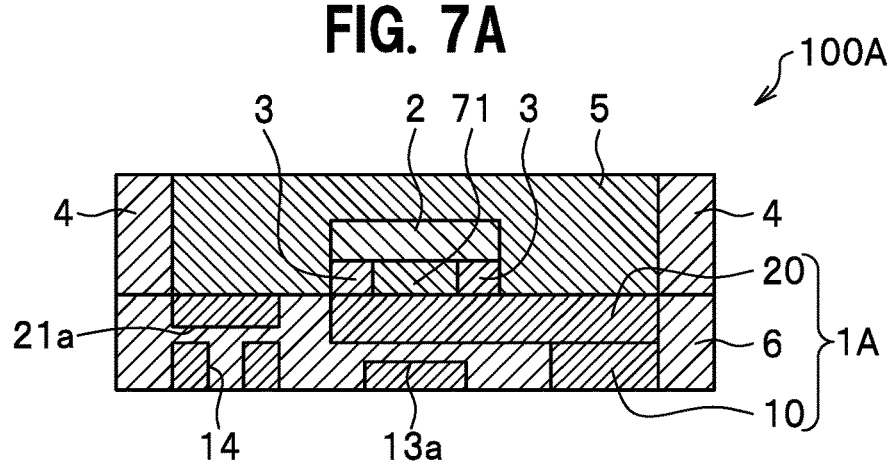
FIG. 7A is a schematic sectional view illustrating a configuration of a package and a light emitting device according to a second embodiment and corresponding to the schematic sectional view taken along the line IIA-IIA in FIG. 1B.
Figure 7B:
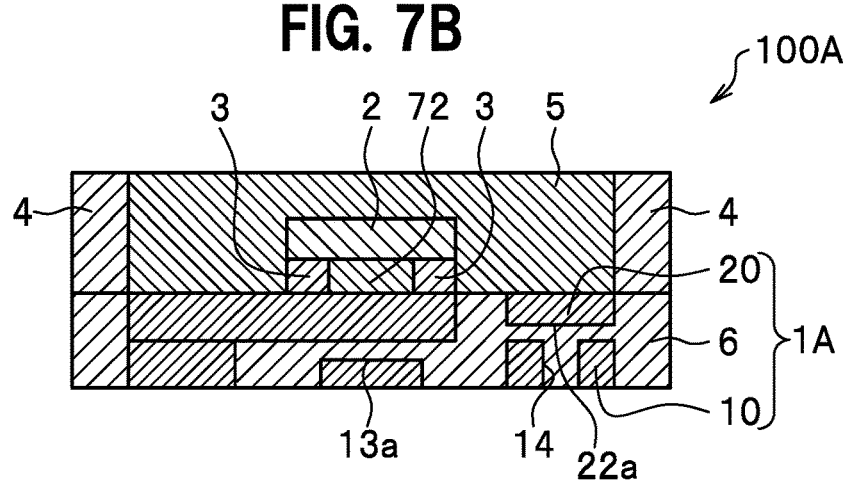
FIG. 7B is a schematic sectional view illustrating the configuration of the package and the light emitting device according to the second embodiment and corresponding to the schematic sectional view taken along the line IIB-IIB in FIG. 1B.
Figure 7C:
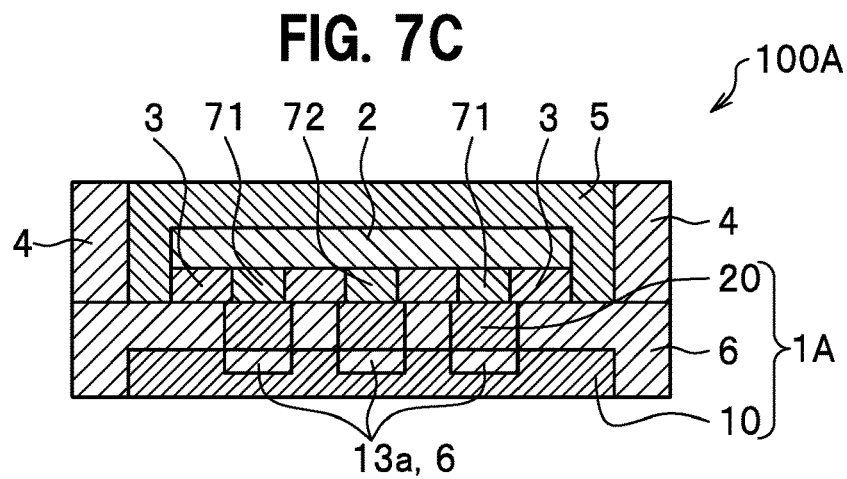
FIG. 7C is a schematic sectional view illustrating the configuration of the package and the light emitting device according to the second embodiment and corresponding to the schematic sectional view taken along the line IIC-IIC in FIG. 1B.

FIG. 7A is a schematic sectional view illustrating a configuration of a package and a light emitting device according to a second embodiment and corresponding to the schematic sectional view taken along the line IIA-IIA in FIG. 1B. FIG. 7B is a schematic sectional view illustrating the configuration of the package and the light emitting device according to the second embodiment and corresponding to the schematic sectional view taken along the line IIB-IIB in FIG. 1B. FIG. 7C is a schematic sectional view illustrating the configuration of the package and the light emitting device according to the second embodiment and corresponding to the schematic sectional view taken along the line IIC-IIC in FIG. 1B.

Package and Light Emitting Device

First, a package 1A and a light emitting device 100A will be described. The package 1A includes a first lead 10, a second lead 20, and a molded body 6. The package 1A includes the first lead 10 having a first through hole 14 in a first portion, the second lead 20 having second recess portions 21a and 22a provided in a second portion overlapping the first portion of the first lead 10, on a surface side face-to-face bonded to the first lead 10 and communicating with the first through hole 14, and the molded body 6 holding the first lead 10 and the second lead 20. The first portion of the first lead 10 and the second portion of the second lead 20 are electrode terminals, and a portion of the molded body 6 is continuously filled in the first through hole 14 and the second recess portions 21a and 22a communicating with the first through hole 14. The light emitting device 100A includes the package 1A, a light emitting element 2, underfill 3, a frame body 4, and a covering member 5.

In the package 1A and the light emitting device 100A according to the second embodiment, the molded body holding the first lead 10 and the molded body holding the second lead 20 integrally form one molded body 6. The configurations other than the configuration described above are the same as the package 1 and the light emitting device 100 according to the first embodiment.

Method of Manufacturing Package

Figure 8A:
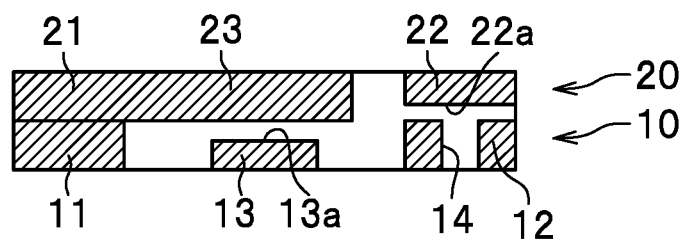
FIG. 8A is a schematic sectional view illustrating a state in which a second lead is disposed on a first lead in a method of manufacturing the package according to the second embodiment.
Figure 8B:
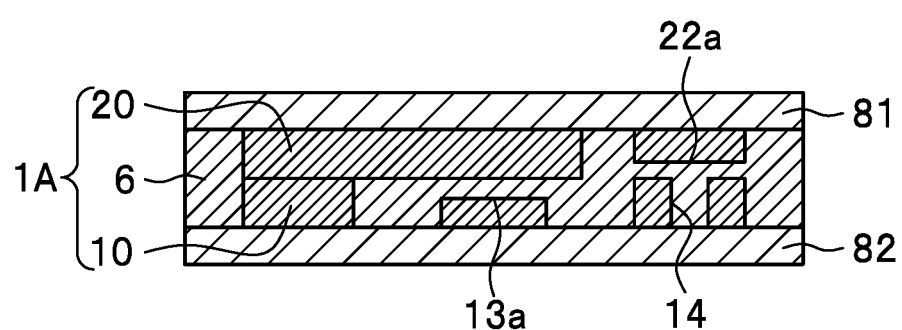
FIG. 8B is a schematic sectional view illustrating a step of forming a molded body on the first lead and the second lead in the method of manufacturing the package according to the second embodiment.

Next, a method of manufacturing the package 1A will be described. FIG. 8A is a schematic sectional view illustrating a state in which the second lead is disposed on the first lead in the method of manufacturing the package according to the second embodiment. FIG. 8B is a schematic sectional view illustrating a step of forming the molded body on the first lead and the second lead in the method of manufacturing the package according to the second embodiment. FIGS. 8A and 8B schematically illustrate one package of a plurality of packages manufactured simultaneously.

The method of manufacturing the package includes the steps of: preparing a first lead and a second lead, and filling a molded body, and these steps are performed in this order. The materials, the disposition, and the like of the members of the package 1A are as described above in the package 1 and are not described here for convenience.

Step of Preparing First Lead and Second Lead

In the method of manufacturing the package according to the first embodiment, the first molded body 61 is formed on the first lead 10 as illustrated in FIG. 5A. In the method of manufacturing the package according to the second embodiment, however, the first molded body 61 is not formed on the first lead 10 as illustrated in FIG. 8A. The procedures other than the procedure described above are the same as the method of manufacturing the package according to the first embodiment.

Step of Filling Molded Body

The step of filling a molded body is a step of bonding the first lead 10 and the second lead 20 and then forming the molded body 6 holding the first lead 10 and the second lead 20. In this step, the first lead 10 and the second lead 20 are sandwiched between the upper mold 81 and the lower mold 82, and a resin is injected into the first lead 10 and the second lead 20. Thereby, the resin is injected into the through hole 14 via the second recess portions 21a and 22a. Next, the resin injected between the molds is cured to form the molded body 6. Thereafter, burr is removed to shape the first molded body.

Method of Manufacturing Light Emitting Device

Next, a method of manufacturing the light emitting device 100A will be described. The method of manufacturing the light emitting device 100A is the same as the method of manufacturing the light emitting device 100 according to the first embodiment except for using the package 1A that has the molded body 6 of the first lead 10 and the molded body 6 of the second lead 20 integrally molded therein.

Other Embodiments

Figure 9A:
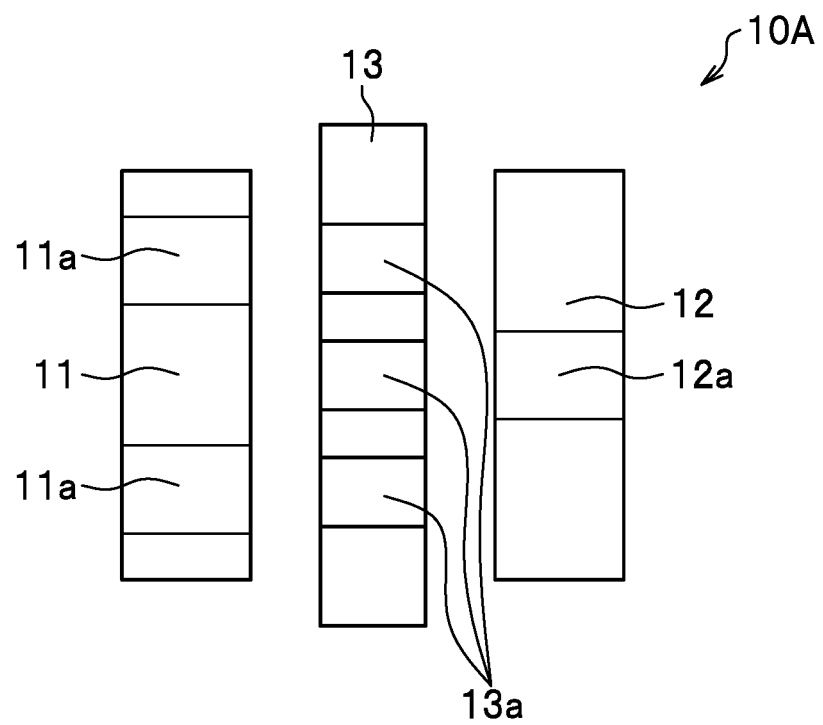
FIG. 9A is a schematic plan view illustrating a configuration of a first lead according to another embodiment.
Figure 9B:
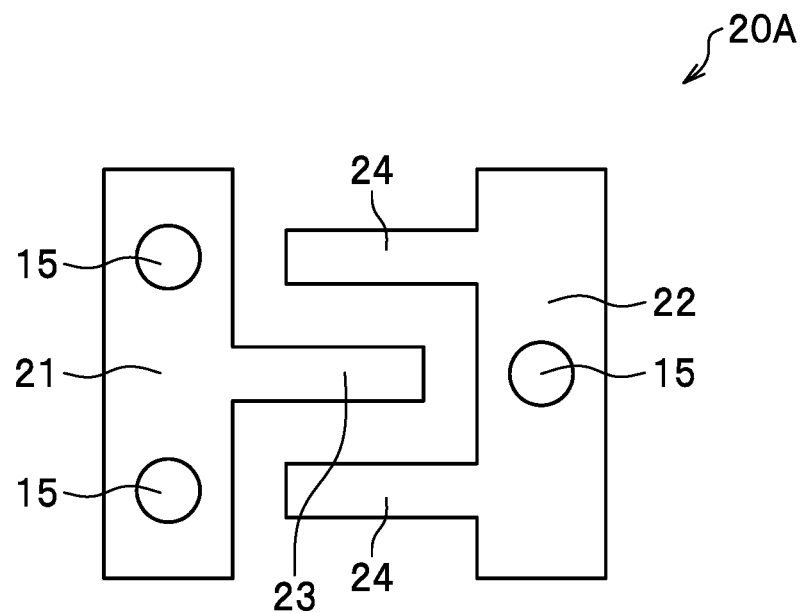
FIG. 9B is a schematic plan view illustrating a configuration of a second lead according to another embodiment.
Figure 9C:
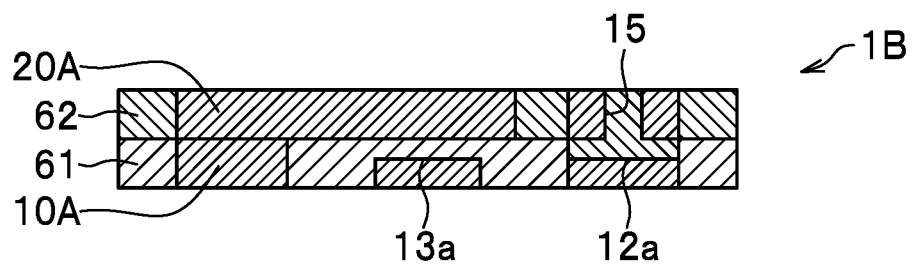
FIG. 9C is a schematic sectional view illustrating a configuration of a package according to another embodiment and corresponding to the schematic sectional view taken along the line IIB-IIB in FIG. 1B.

First, a package 1B and a method of manufacturing the package 1B will be described. FIG. 9A is a schematic plan view illustrating a configuration of a first lead according to another embodiment. FIG. 9B is a schematic plan view illustrating a configuration of a second lead according to another embodiment. FIG. 9C is a schematic sectional view illustrating a configuration of a package according to another embodiment and corresponding to the schematic sectional view taken along the line IIB-IIB in FIG. 1B.

In the package 1B, as illustrated in FIG. 9A, the first lead may be a first lead 10A having first recess portions 11a and 12a in a first P-side electrode terminal 11 and a first N-side electrode terminal 12. Further, in the package 1B, as illustrated in FIG. 9B, the second lead may be a second lead 20A having a second through hole 15 in a second P-side electrode terminal 21 and a second N-side electrode terminal 22. As illustrated in FIG. 9C, in the package 1B, a portion of a second molded body 62 is continuously filled in the first recess portions 11a and 12a and the second through hole 15. The package 1B may be a molded body in which the first molded body 61 and the second molded body 62 are integrally molded. The shapes, the number, and the like of the first recess portions 11a and 12a and the second through holes 15 are the same as those of the second recess portions 21a and 22a and the first through holes 14 in the first embodiment.

In the package 1B, a portion of the second molded body 62 is continuously filled in the first recess portions 11a and 12a and the second through hole 15, so that the bonding strength between the first lead 10A and the second lead 20A is improved.

The method of manufacturing the package 1B is the same as the method of manufacturing the package 1 or 1A described above. By using the package 1B in the manufacturing of the light emitting device 100 or 100A, it is possible to obtain the light emitting device in which the bonding strength between the leads is improved.

Figure 10:
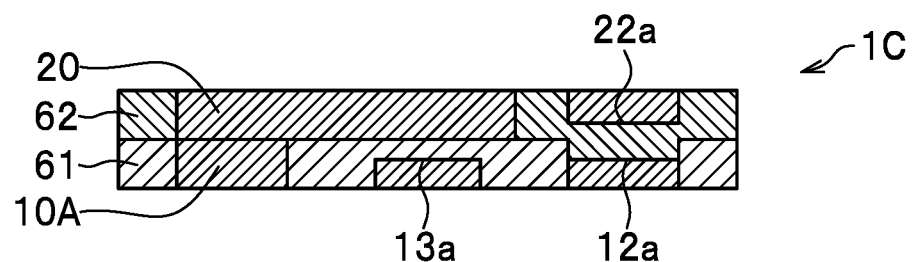
FIG. 10 is a schematic sectional view illustrating a configuration of a package according to another embodiment and corresponding to the schematic sectional view taken along the line IIB-IIB in FIG. 1B.

Next, a package 1C and a method of manufacturing the package 1C will be described. FIG. 10 is a schematic sectional view illustrating a configuration of the package according to another embodiment and corresponding to the schematic sectional view taken along the line IIB-IIB in FIG. 1B. In the package 1C, the first lead may be a first lead 10A (see FIG. 9A) having first recess portions 11a and 12a in a first P-side electrode terminal 11 and a first N-side electrode terminal 12, and the second lead may be a second lead 20 (see FIG. 3B) having second recess portions 21a and 22a in a second P-side electrode terminal 21 and a second N-side electrode terminal 22. In the package 1C, a portion of a second molded body 62 is continuously filled in the first recess portions 11a and 12a and the second recess portions 21a and 22a. The package 1B may be a molded body in which the first molded body 61 and the second molded body 62 are integrally molded. The shapes, the number, and the like of the first recess portions 11a and 12a and the second recess portions 21a and 22a are the same as those of the second recess portions 21a and 22a in the first embodiment.

In the package 1C, a portion of the second molded body 62 is continuously filled in the first recess portions 11a and 12a and the second recess portions 21a and 22a, so that the bonding strength between the first lead 10A and the second lead 20A is improved.

The method of manufacturing the package 1C is the same as the method of manufacturing the package 1 or 1A described above. By using the package 1C in the manufacturing of the light emitting device 100 or 100A, it is possible to obtain the light emitting device in which the bonding strength between the leads is improved.

Figure 11A:
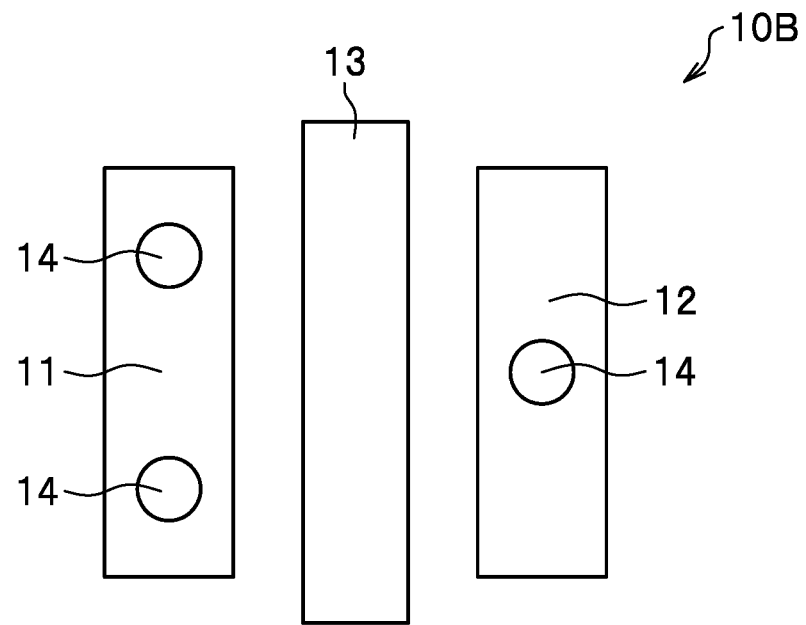
FIG. 11A is a schematic plan view illustrating a configuration of a first lead according to another embodiment.
Figure 11B:
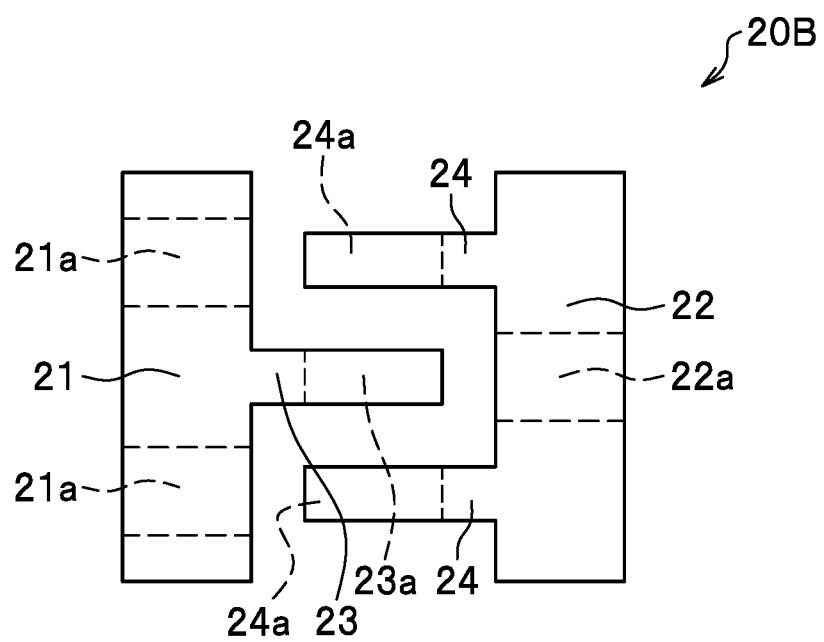
FIG. 11B is a schematic plan view illustrating a configuration of a second lead according to another embodiment.
Figure 11C:
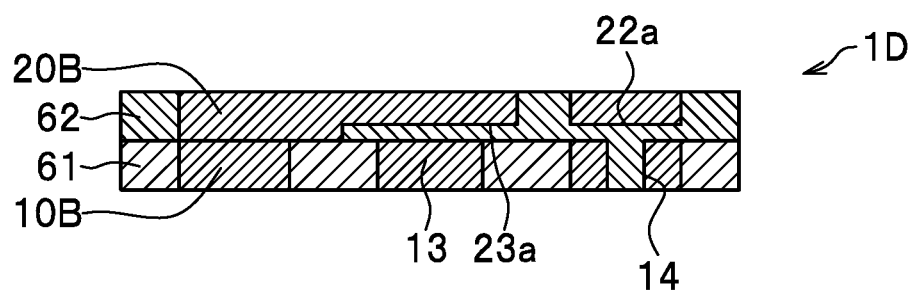
FIG. 11C is a schematic sectional view illustrating a configuration of a package according to another embodiment and corresponding to the schematic sectional view taken along the line IIB-IIB in FIG. 1B.

Next, a package 1D and a method of manufacturing the package 1D will be described. FIG. 11A is a schematic plan view illustrating a configuration of a first lead according to another embodiment. FIG. 11B is a schematic plan view illustrating a configuration of a second lead according to another embodiment. FIG. 11C is a schematic sectional view illustrating a configuration of the package according to another embodiment and corresponding to the schematic sectional view taken along the line IIB-IIB in FIG. 1B.

In the package 1D, as illustrated in FIG. 11A, the first lead may be a first lead 10B in which a heat dissipation terminal 13 has no third recess portion 13a. Further, in the package 1D, as illustrated in FIG. 11B, the second lead may be a second lead 20B having fourth recess portions 23a and 24a on rear surface sides of a P-side terminal branched portion 23 and an N-side terminal branched portion 24. As illustrated in FIG. 11C, in the package 1D, a portion of a second molded body 62 is continuously filled in the fourth recess portions 23a and 24a. The package 1B may be a molded body in which the first molded body 61 and the second molded body 62 are integrally molded. The shapes, the number, and the like of the fourth recess portions 23a and 24a are the same as those of the third recess portion 13a in the first embodiment.

The package 1D has the fourth recess portions 23a and 24a, whereby the heat dissipation terminal 13 is spaced apart from the P-side terminal branched portion 23 and the N-side terminal branched portion 24. Consequently, the P-side terminal branched portion 23 and the N-side terminal branched portion 24 on which the light emitting element is mounted can be arranged on an upper surface of the heat dissipation terminal 13. Therefore, it is possible to form different electrode patterns between a front surface and a rear surface of the package 1D. In addition, it is possible to use a mounting substrate having the same wiring pattern as the wiring pattern on the rear surface of the package 1D and to use the light emitting element having three terminals.

The method of manufacturing the package 1D is the same as the method of manufacturing the package 1 or 1A described above. By using the package 1D in the manufacturing of the light emitting device 100 or 100A, it is possible to obtain the light emitting device in which the bonding strength between the leads is improved.

Figure 12:
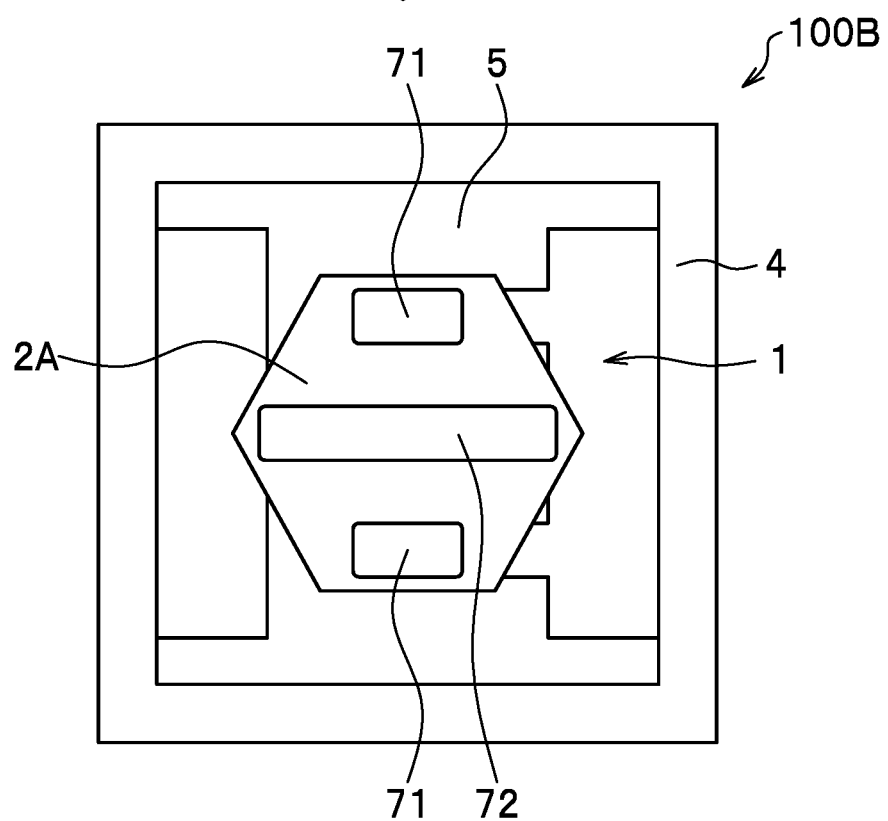
FIG. 12 is a schematic plan view illustrating a configuration of a light emitting device according to another embodiment.

Next, a light emitting device 100B is described. FIG. 12 is a schematic plan view illustrating a configuration of a light emitting device according to another embodiment. Like the light emitting device 100B illustrated in FIG. 12, the light emitting element may be a light emitting element 2B having a hexagonal shape in planar view. Use of the light emitting element 2B having a hexagonal shape in planar view decreases the distance from a side surface of the light emitting element 2B to the frame body 4 to improve the light extraction efficiency. The light emitting element may have a polygonal shape other than the hexagonal shape in planar view. The method of manufacturing the light emitting device 100B is the same as the method of manufacturing the light emitting device 100 or 100A described above.

Figure 13A:
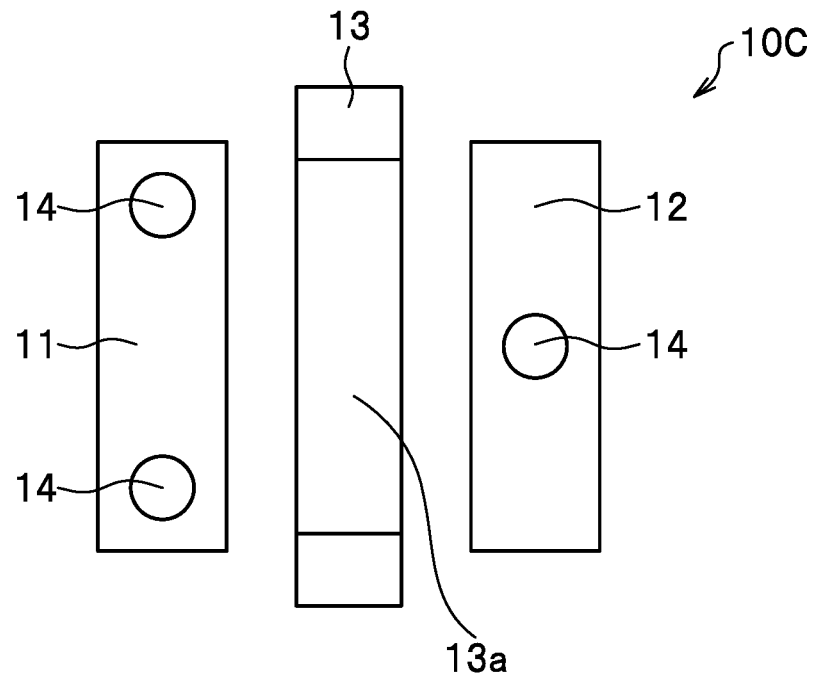
FIG. 13A is a schematic plan view illustrating a configuration of a first lead according to another embodiment.
Figure 13B:
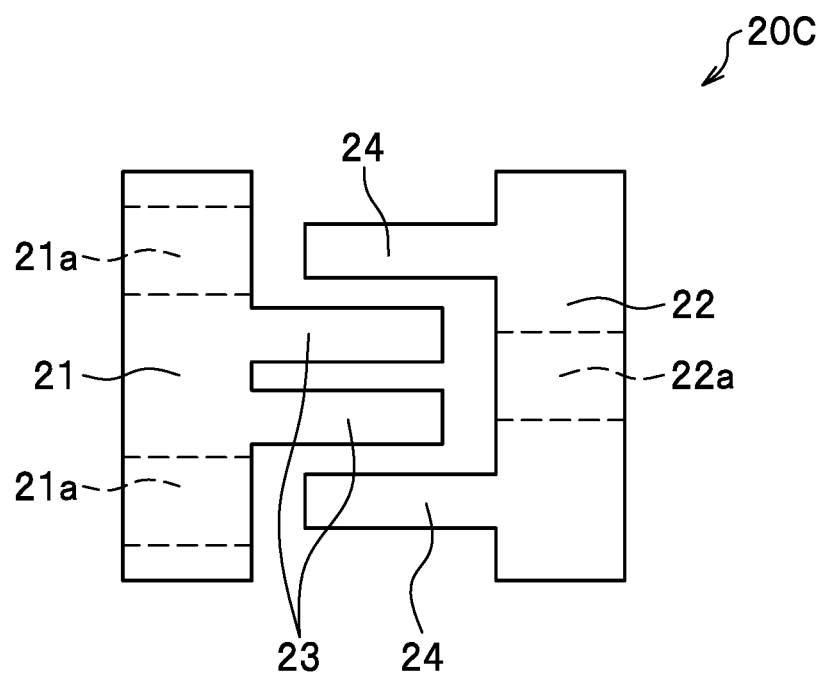
FIG. 13B is a schematic plan view illustrating a configuration of a second lead according to another embodiment.
Figure 13C:
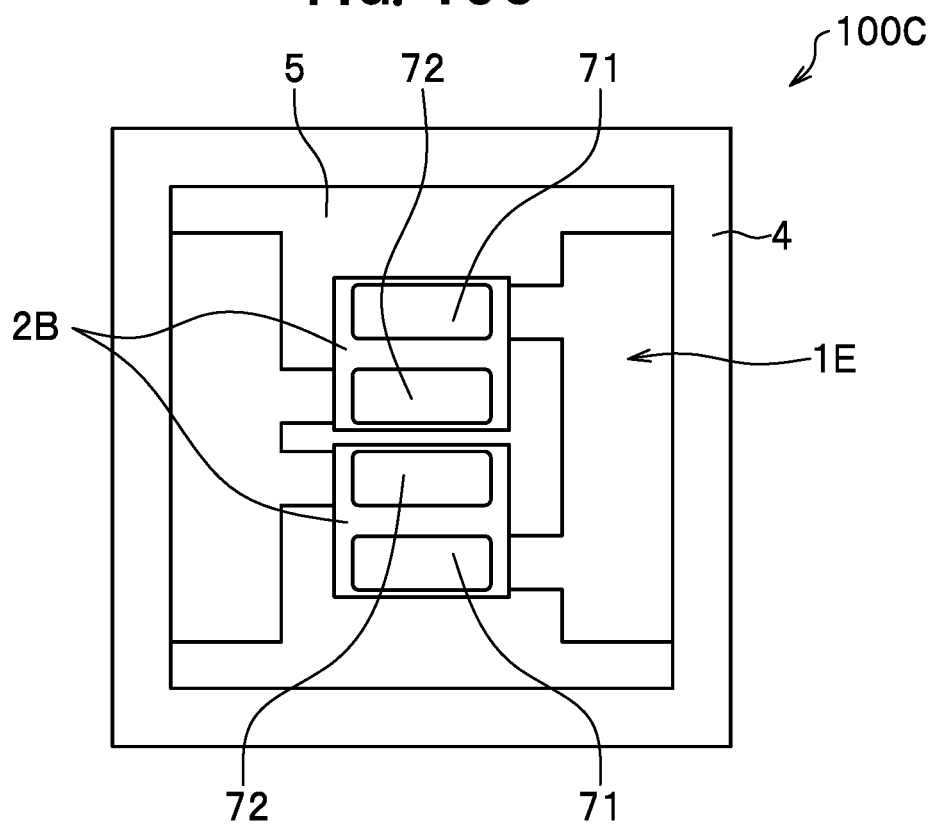
FIG. 13C is a schematic plan view illustrating a configuration of a light emitting device according to another embodiment.

Next, a package 1E, a light emitting device 100C, and a method of manufacturing the package 1E will be described. FIG. 13A is a schematic plan view illustrating a configuration of a first lead according to another embodiment. FIG. 13B is a schematic plan view illustrating a configuration of a second lead according to another embodiment. FIG. 13C is a schematic plan view illustrating a configuration of the light emitting device according to another embodiment.

In the package 1E, as illustrated in FIG. 13A, the first lead may be a first lead 10C in which one third recess portion 13a is formed in a region excluding upper and lower end portions of a heat dissipation terminal 13. Further, in the package 1E, as illustrated in FIG. 13B, the second lead may be a second lead 20C that includes two P-side terminal branched portions 23, with the two P-side terminal branched portions 23 disposed between the two N-side terminal branched portions 24. As illustrated in FIG. 13C, the light emitting device may be a light emitting device 100C obtained by preparing two light emitting elements 2B each having one N-side electrode 71 and one P-side electrode 72, and mounting the two light emitting elements 2B on the package 1E.

The method of manufacturing the package 1E is the same as the method of manufacturing the package 1 or 1A described above. By using the package 1E in the manufacturing of the light emitting device 100 or 100A, it is possible to obtain the light emitting device 100C in which the bonding strength between the leads is improved.

Figure 14:
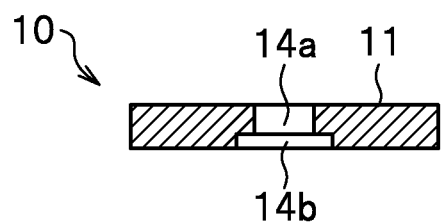
FIG. 14 is a schematic sectional view of a first lead according to another embodiment and corresponding to the schematic sectional view taken along the line XIV-XIV in FIG. 3A.

Next, another embodiment of a through hole of a package will be described. FIG. 14 is a schematic sectional view of a first lead according to another embodiment and corresponding to the schematic sectional view taken along the line XIV-XIV in FIG. 3A. In a package 1, preferably, a through hole 14 of a first P-side electrode terminal 11 of a first lead 10 includes two holes having different inner diameters, and the inner diameter of a hole 14b on a rear surface side is larger than the inner diameter of a hole 14a on a front surface side. Consequently, it is possible to prevent a resin of a second molded body filled in the through hole 14 from falling off from the rear surface side, and a bonding force of the first lead 10 is further improved. It is preferable that the other through holes 14 of the first lead 10 also include the two holes 14a and 14b. Further, it is preferable that the respective through holes 14 of the package 1A illustrated in FIGS. 7A and 7B, the package 1D illustrated in FIG. 11C, and the package 1E illustrated in FIGS. 13A and 13C also include the two holes 14a and 14b.

Next, another embodiment of a package will be described. In the packages 1 and 1A to 1E as illustrated in FIGS. 2B, 7B, 9C, 10, 11C, 13A, and 13C, the first leads 10 and 10A to 10C may not include the heat dissipation terminal 13. In addition, the packages 1 and 1A to 1E have no recess portion formed by half etching in any of the heat dissipation terminal 13, the P-side terminal branched portion 23, and the N-side terminal branched portion 24, and a portion of the first molded body 61, the second molded body 62, or the molded body 6 may not be filled between the heat dissipation terminal 13 and each of the P-side terminal branched portion 23 and the N-side terminal branched portion 24.

Figure 15A:
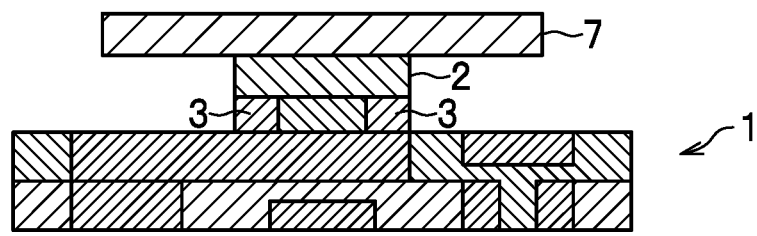
FIG. 15A is a schematic sectional view illustrating a step of forming a sheet member in a method of manufacturing a light emitting device according to another embodiment.
Figure 15B:
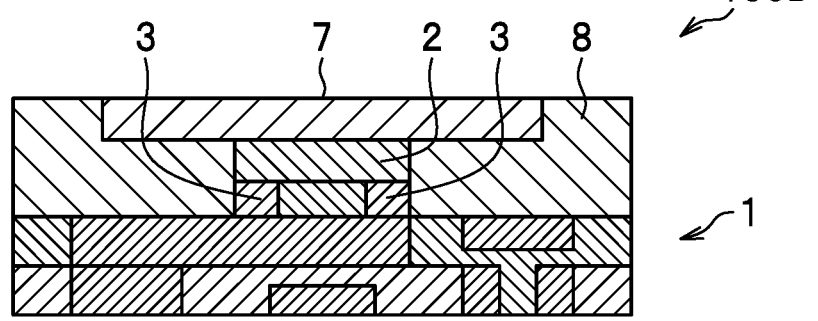
FIG. 15B is a schematic sectional view illustrating a step of forming a side wall member in a method of manufacturing a light emitting device according to another embodiment.

Next, another method of manufacturing a package will be described. FIG. 15A is a schematic sectional view illustrating a step of forming a sheet member in a method of manufacturing a light emitting device according to another embodiment. FIG. 15B is a schematic sectional view illustrating a step of forming a side wall member in the method of manufacturing the light emitting device according to another embodiment.

As illustrated in FIG. 15B, the light emitting device may be a light emitting device 100D including a sheet member 7 disposed on an upper surface of a light emitting element 2, and a side wall member 8 disposed on a side surface of the sheet member 7, a side surface of the light emitting element 2, and a side surface of underfill 3. As a material for the sheet member 7, it is possible to use the same material as the covering member. It is possible to add to the sheet member 7 a fluorescent material or a filler such as a high-light-reflectivity substance. As a material for the side wall member, it is possible to use the same material as the frame body.

It is possible to perform a method of manufacturing the light emitting device 100D, for example, as described below after the step of forming the underfill 3. First, as illustrated in FIG. 15A, the sheet member 7 having a prescribed size is attached to the upper surface of the light emitting element 2 with, for example, an adhesive resin (step of forming a sheet member). Next, as illustrated in FIG. 15B, the side wall member 8 is applied to lateral side surfaces of, for example, the light emitting element 2 (step of forming a side wall member). Thereafter, an aggregate of light emitting devices 100D is cut and divided into pieces. The procedures other than the procedures described above are the same as the method of manufacturing the light emitting device 100 according to the first embodiment.

The package and the light emitting device according to the embodiment of the present disclosure have sufficient bonding strength between the leads as compared with the conventional package in which two leads are bonded by resin, solder, or the like. According to the method of manufacturing a package according to the embodiment of the present disclosure, a package having sufficient bonding strength between the leads can be manufactured as compared with a conventional method of manufacturing a package. According to the method of manufacturing a light emitting device according to the embodiment of the present disclosure, a light emitting device having a package having sufficient bonding strength between the leads can be manufactured as compared with a conventional light emitting device.

As described above, the packages and the light emitting devices according to the present embodiments and the methods of manufacturing them have been specifically described by way of DESCRIPTION OF THE EMBODIMENTS. The subject matter of the present invention is, however, not to be limited to this description but is to be widely interpreted on the basis of the description of claims. Various changes, modifications, and the like based on this description are included in the subject matter of the present invention.

For example, the method of manufacturing a package and the method of manufacturing a light emitting device may include an additional step between steps, or before or after a step of the above-mentioned steps as long as the additional step does not adversely affect each of the steps. For example, the methods may include a foreign matter removal step of removing foreign matter mixed during manufacturing.

Obviously, numerous modifications and variations of the present invention are possible in light of the above teachings. It is therefore to be understood that within the scope of the appended claims, the invention may be practiced otherwise than as specifically described herein.

What is claimed is:

1. A package comprising:
   a first lead including a first portion which has a first recess portion or a first through hole passing through the first portion;
   a first molded body holding the first lead;
   a second lead having a bonding side surface and provided on the first lead to be bonded to the first lead such that the bonding side surface faces to the first lead, the second lead including a second portion which overlaps with the first portion and which has a second recess portion on the bonding side surface or a second through hole passing through the second portion, the second recess portion communicating with the first through hole, the second through hole communicating with the first recess portion which faces to the second portion;
   the first portion of the first lead and the second portion of the second lead being electrode terminals; and
   a second molded body holding the second lead and filling the first through hole and the second recess portion, or filling the first recess portion and the second through hole.

2. The package according to claim 1, wherein the first through hole or the first recess portion is not filled with the first molded body.

3. The package according to claim 1, wherein the first molded body has a same thickness as a thickness of the first lead, and the second molded body has a same thickness as a thickness of the second lead.

4. The package according to claim 1, wherein the first recess portion is a groove portion continuing to a side surface of the first lead, and the second recess portion is a groove portion continuing to a side surface of the second lead.

5. The package according to claim 1, wherein
   the first lead has a third recess portion in a third portion spaced apart from the first portion and overlapping the second lead,
   the third portion of the first lead is a terminal electrically independent from the electrode terminal, and a fourth portion of the second lead overlapping the third portion is a terminal branched portion continuous with the electrode terminal,
   the third recess portion is a groove portion continuing to the side surface of the first lead, and
   a space between the third recess portion and the fourth portion is filled with the first molded body.

6. The package according to claim 1, wherein
   the second lead has a fourth recess portion in a fourth portion continuous with the second portion and overlapping the first lead,
   the fourth portion of the second lead is a terminal branched portion continuous with the electrode terminal, the third portion of the first lead overlapping the fourth portion is a terminal electrically independent from the electrode terminal,
   the fourth recess portion is a groove portion continuing to the side surface of the second lead, and
   a space between the fourth recess portion and the third portion are filled with the second molded body.

7. A light emitting device comprising:
   the package according to claim 1; and
   a light emitting element mounted on the package.

8. The light emitting device according to claim 7, further comprising:
   a frame body provided to surround the light emitting element; and
   a covering member formed in the frame body to cover the light emitting element.

9. The light emitting device according to claim 7, wherein the light emitting element has a polygonal shape in planar view.

10. A package comprising:
    a first lead including a first portion which has a first recess portion;
    a first molded body holding the first lead;
    a second lead having a bonding side surface and provided on the first lead to be bonded to the first lead such that the bonding side surface faces to the first lead, the second lead including a second portion which overlaps with the first portion and which has a second recess portion on the bonding side surface, the second recess portion communicating with the first recess portion which faces to the second portion;
    the first portion of the first lead and the second portion of the second lead being electrode terminals; and
    a second molded body holding the second lead and filling the first recess portion and the second recess portion.

11. The package according to claim 10, wherein the first recess portion is not filled with the first molded body.

12. A method of manufacturing a package, the method comprising:
    providing a first lead including a first electrode terminal which has a first recess portion or a first through hole passing through the first electrode terminal;
    holding the first lead with a first molded body;
    providing a second lead on the first lead to be bonded to the first lead such that the bonding side surface of the second lead faces to the first lead, the second lead including a second electrode terminal which overlaps with the first electrode terminal and which has a second recess portion on the bonding side surface or a second through hole passing through the second electrode terminal, the second recess portion communicating with the first through hole, the second through hole communicating with the first recess portion which faces to the second electrode terminal;

holding the second lead with a second molded body; and filling the first through hole and the second recess portion, or the first recess portion and the second through hole with the second molded body.

13. A method of manufacturing a light emitting device, the method comprising:

mounting a light emitting element on the package manufactured by the method according to claim 12.

14. A method of manufacturing a package, the method comprising:

providing a first lead including a first electrode terminal which has a first recess portion;

holding the first lead with a first molded body;

providing a second lead on the first lead to be bonded to the first lead such that the bonding side surface of the second lead faces to the first lead, the second lead including a second electrode terminal which overlaps with the first electrode terminal and which has a second recess portion on the bonding side surface, the second recess portion communicating with the first recess portion which faces to the second electrode terminal;

holding the second lead with a second molded body; and filling the first recess portion and the second recess portion with the second molded body.

15. A package comprising:

a first lead including a first electrode terminal which has a first recess portion or a first through hole passing through the first electrode terminal;

a second lead having a bonding side surface and provided on the first lead to be bonded to the first lead such that the bonding side surface faces to the first lead, the second lead including a second electrode terminal which overlaps with the first electrode terminal and which has a second recess portion on the bonding side surface or a second through hole passing through the second electrode terminal, the second recess portion communicating with the first through hole, the second through hole communicating with the first recess portion which faces to the second electrode terminal; and a molded body holding the first lead and the second lead and filling the first through hole and the second recess portion, or filling the first recess portion and the second through hole.

16. A package comprising:

a first lead including a first electrode terminal which has a first recess portion;

a second lead having a bonding side surface and provided on the first lead to be bonded to the first lead such that the bonding side surface faces to the first lead, the second lead including a second electrode terminal which overlaps with the first electrode terminal and which has a second recess portion on the bonding side surface, the second recess portion communicating with the first recess portion which faces to the second electrode terminal; and a molded body holding the first lead and the second lead and filling the first recess portion and the second recess portion.

17. A method of manufacturing a package, the method comprising:

providing a first lead including a first electrode terminal which has a first recess portion or a first through hole passing through the first electrode terminal;

providing a second lead on the first lead to be bonded to the first lead such that the bonding side surface of the second lead faces to the first lead, the second lead including a second electrode terminal which overlaps with the first electrode terminal and which has a second recess portion on the bonding side surface or a second through hole passing through the second electrode terminal, the second recess portion communicating with the first through hole, the second through hole communicating with the first recess portion which faces to the second electrode terminal;

holding the first lead and the second lead with a molded body; and filling the first through hole and the second recess portion, or the first recess portion and the second through hole with the molded body.

18. A method of manufacturing a package, the method comprising:

providing a first lead including a first electrode terminal which has a first recess portion;

providing a second lead on the first lead to be bonded to the first lead such that the bonding side surface of the second lead faces to the first lead, the second lead including a second electrode terminal which overlaps with the first electrode terminal and which has a second recess portion on the bonding side surface, the second recess portion communicating with the first recess portion which faces to the second electrode terminal;

holding the first lead and the second lead with a molded body; and filling the first recess portion and the second recess portion with the molded body.

* * * * *